United States Patent [19]
Chapman

[11] 4,029,962
[45] June 14, 1977

[54] ARRAYS FOR INFRARED IMAGE DETECTION

[75] Inventor: Richard Alexander Chapman, Dallas, Tex.

[73] Assignee: Texas Instruments Incorporated, Dallas, Tex.

[22] Filed: June 23, 1975

[21] Appl. No.: 589,104

[52] U.S. Cl. .............................. 250/338; 250/352; 250/370

[51] Int. Cl.² .......................................... G01J 1/00

[58] Field of Search .......... 250/332, 338, 339, 340, 250/370, 371, 211 J, 352; 357/49; 307/311

[56] References Cited

UNITED STATES PATENTS

| | | | |
|---|---|---|---|
| 2,812,446 | 11/1957 | Pearson | 250/211 J |
| 3,005,937 | 10/1961 | Wallmark et al. | 357/49 |
| 3,691,389 | 9/1972 | Ellis et al. | 250/211 J |

*Primary Examiner*—Davis L. Willis

*Attorney, Agent, or Firm*—Harold Levine; James T. Comfort; William E. Hiller

[57] ABSTRACT

This disclosure defines an infrared image detector formed in a block of semiconductor material by etching slots in the semiconductor material. The slots define the individual detectors, effectively isolate them from each other both optically and electrically, and permit the detectors to be placed very close to each other. Biasing slots are etched in each detector and on two opposing sides of the detector and the walls of the slots are made highly conductive by an impurity diffusion or coating or alternatively the slots is filled with a conducting material. The conducting layer or material in each slot is connected to a conductor on the surface of the semiconductor wafer so that the conductor inside the biasing slot serves as an electrical contact for the detector. The detectors are biased electrically by applying a voltage difference between two different sets of conducting slots.

21 Claims, 11 Drawing Figures

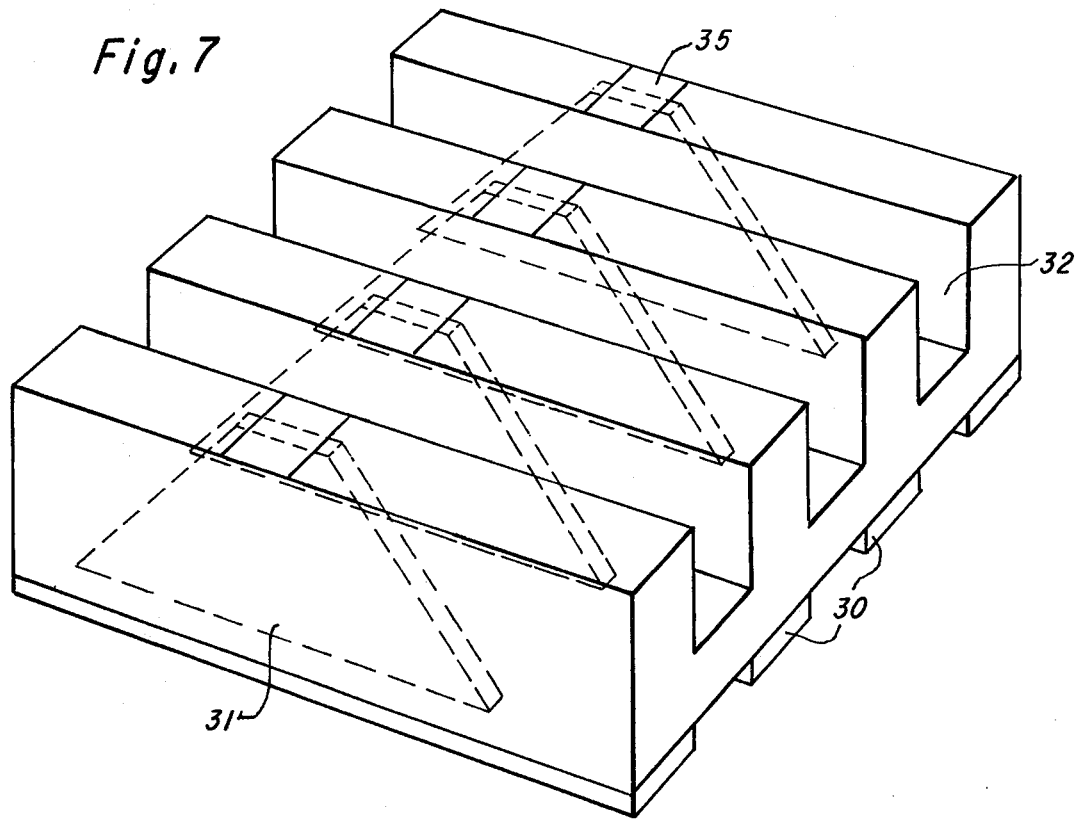
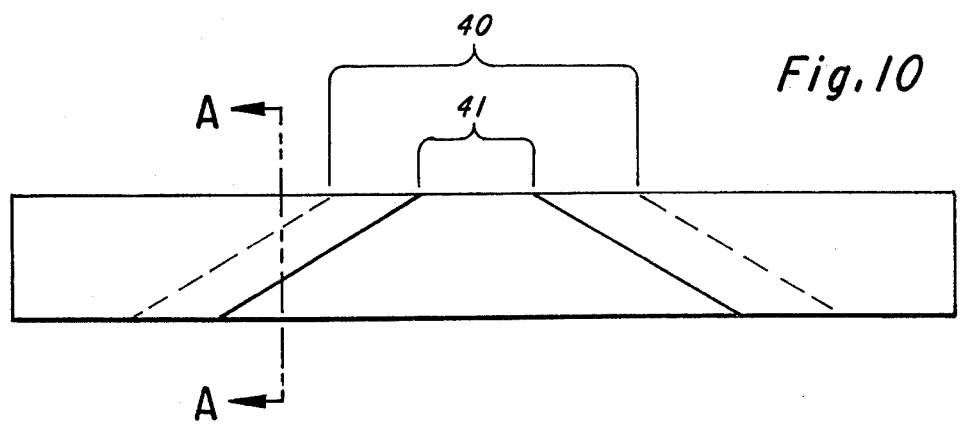

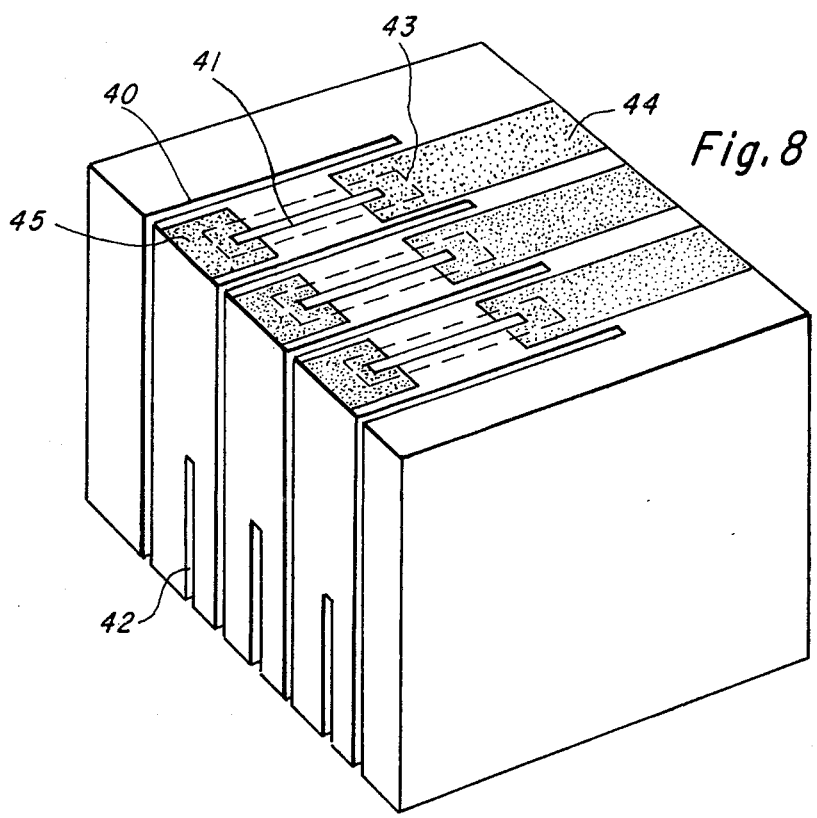
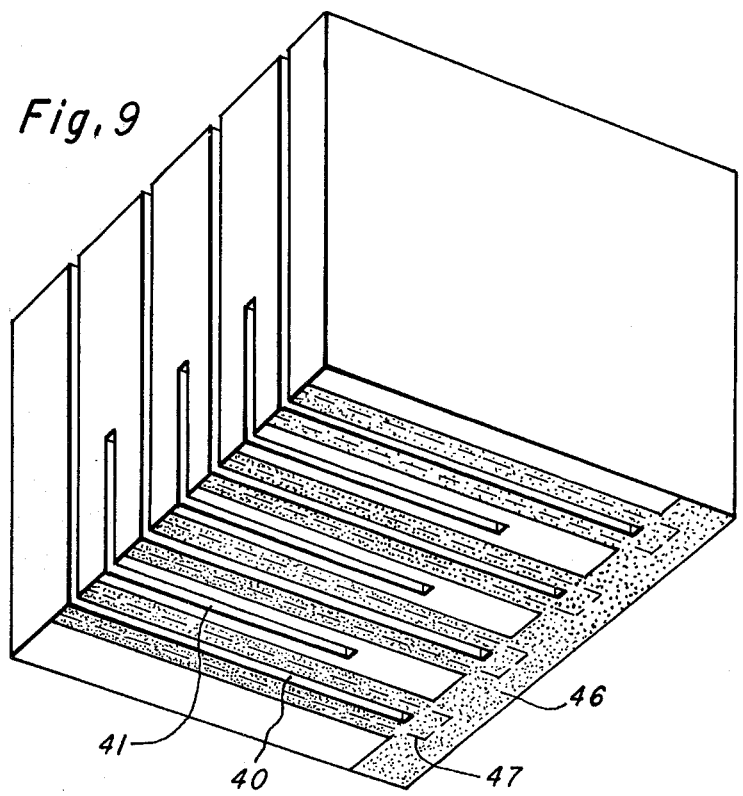

ARRAYS FOR INFRARED IMAGE DETECTION

This invention relates to infrared image detectors and more particularly to an array of detectors formed from a single block of semiconductor material.

THE PRIOR ART

Near-infrared and visible image detectors have been made in the past using arrays of silicon photodiodes. These detectors use "intrinsic" band-to-band photoabsorption transitions. Readout from these arrays has been by utilizing one set of leads in the X-Dimension and one set of leads in the Y-dimension addressing a matrix array of silicon photodiodes.

Non-visible longer wavelength infrared detectors have been fabricated using doped semiconductors with extrinsic photoresponse due to photoionization of the impurity dopant. Detectors for the 3–5 micrometer, 8–14 micrometer, and longer wavelengths have been built. The wavelength band for infrared detection depends on the impurity added (thus, "extrinsic" response). The detector is usually a photoconductive detector with the semiconductor being doped to be either wholly N-type or wholly P-type. Efficient infrared sensitivity is obtained by cryogenically cooling the semiconductor to a low temperature (typically 65–77 K temperature for silicon doped for 3–5 micrometer response and 20–30 K temperature for silicon doped for 8–18 micrometer response); the conductivity of the doped semiconductor is considerably reduced by cooling so that the infrared induced conductivity can be detected.

In the past, arrays of silicon and germanium infrared photoconductive detectors have been made by fabricating individual detectors and assemblying these together to make an array. Alternatively, monolithic arrays of silicon detectors have been fabricated in one slice of silicon, but this technology is limited to the use of relatively large detectors with large separations to minimize optical and electrical cross-talk. In the case of mercury-doped germanium photoconductive detectors, the germanium must be the order of one centimeter thick in the direction of the incident radiation. Linear arrays of mercury-doped germanium detectors have been fabricated by the use of orientation dependent etching. In this case, the infrared radiation is incident on the edge of a mercury-doped germanium wafer through which slots have been etched parallel to the direction of the incident radiation and separating the wafer into long narrow detectors which may be typically 1 mm × 1 mm × 1 cm. The slots are etched into the top surface of the germanium wafer and the electrical contacts are placed on the top and bottom of the germanium wafer. This mercury-doped germanium array structure is not monolithic after etching, only linear arrays can be fabricated, and the structure is not adaptable to combining the detectors and the electronic processing circuitry (such as preamps and multiplexers) on the same wafer.

In co-pending U.S. patent application Ser. No. 563,541, filed Mar. 31, 1975, there is disclosed a matrix array for infrared image detection wherein two sets of slots are etched in a doped silicon substrate by orientation dependent etching. The first set of slots is etched from the top surface of the substrate to form a plurality of parallel slots, and the second set of slots is etched from the bottom surface of the substrate to form a plurality of parallel slots extending in a direction which intersects the direction of the first set. The top and bottom slots intersect with each other inside the slice. Either silicon or germanium may be used for the slice. When these materials are used, a (110) crystal orientation is used and the vertical walls of the slots etched thereby by orientation dependent etching are (111) surfaces.

In the patent application Ser. No. 563,541, the electrical biasing semiconductor is from the aforesaid top to the bottom of the semiconductor slice. The top surface of the slice has an electrically conductive metal coating of varying thickness deposited in part on an insulator placed on the semiconductor such that substantially thick opaque metallic regions are disposed in spaced-apart relationship along the top surface passing along the top of the semiconductor bars defined by the slots etched in the top surface. A relatively thin transparent metallic layer may be disposed elsewhere on the top surface of the semiconductor substrate. These metallization layers form the electrical contacts to the tops of the detectors, serve as optical field stops, and electrical leads to the electronic processing circuitry. Alternatively, a thin P+ layer may be substituted for the thin metallic layer if a P-type semiconductor is used and a thin N+ layer if an N-type semiconductor is used.

The bottom surface of the semiconductor substrate has metallic layers serving as leads and also as the bottom electrical connections for the detectors. This metallic layer passes along the bottom surface of the semiconductor bars defined by the slots etched in the bottom surface.

A nonconductive opaque material may be deposited in the top slots to block incident radiation from injecting radiation signal and noise into the detector through the slots. Alternatively, the slots may be made extremely narrow to minimize sensitivity to radiation incident on the slots and then no opaque coating will be required.

It is intended to operate the array at a low temperature (e.g., below about 30 K for gallium-doped silicon or below about 77 K for indium-doped silicon) so that the resistance of the detector is set by the photogenerated majority carriers in the semiconductor substrate due to radiation background incident on the top of the substrate.

Low noise ohmic contacts may be provided by diffusing a P+ layer into the P-type semiconductor substrate, wherein the P+ layers are formed on the top and bottom of the substrate prior to etching of the slots. A diffusion mask may be used on the top surface of the semiconductor to limit the top P+ regions to the tops of the infrared detectors. When an N-type semiconductor is used, N+ layers are formed in a similar manner.

This method of fabricating arrays of infrared detectors permits the placement of the electronic processing circuitry on the same semiconductor wafer with the infrared detectors. For instance, if the matrix array is fabricated in the center region of a semiconductor wafer, electronic processing circuitry such as preamplifiers and multiplexing circuits may be fabricated on the top (and bottom) surface of the semiconductor surrounding the matrix array. The electronic processing circuitry and the infrared detectors may be electrically connected by metal leads deposited on the oxidized (or otherwise electrically isolated) semiconductor surface.

SUMMARY OF THE INVENTION

One feature of the invention is an array of infrared detectors formed in a single wafer of semiconductor material. Two sets of different parallel slots are etched into the semiconductor slice and the walls of these slots are impurity diffused or coated so that the surface of these slots are highly conducting and serve as ohmic contacts to the semiconductor remaining between adjoining slots. The semiconductor between adjoining slots is electrically biased so that this material will be photoconductive and detect infrared radiation; the bias is provided by a potential difference applied between alternate slots. If impurity diffusion is used to make the slot walls conductive, a heavy P+ impurity diffusion is used if the semiconductor is doped P-type; conversely, a heavy N+ impurity diffusion is used if the semiconductor is doped N-type. In the matrix embodiment of this invention an additional set of slots is etched into the semiconductor to intersect and divide one of the two sets of slots into individual contacts for the detectors.

The formation of the slots and the coating thereof with material or impurity diffusion is to accomplish an increase in the photoconductive gain of each of the detectors by bringing the contacts very close together in comparison to the thickness of the semiconductor slice.

Another feature of the invention is to produce matrix arrays of detectors having a significantly higher photoconductive gain and of low noise inherent background noise.

An additional feature of the invention is a matrix array of image detectors forming a single block of intrinsic semiconductor material by etching slots in the semiconductor wafer to define the detectors and by etching slots within each detector which extend, for the most part, through the interior region of the detector.

The invention is not limited to matrix arrays and includes linear arrays or any other geometrical combination of detectors to form an array.

DESCRIPTION OF THE DRAWINGS

For more complete understanding of the present invention and for further features and technical advances provided thereby, reference may now be made to the following description taken in conjunction with the accompanying drawings, in which:

FIG. 7 is a top perspective view of the linear array embodiment of FIG. 6.

FIG. 8 is a partial top perspective view of another embodiment of a linear array taken along line A—A of FIG. 10.

FIG. 9 is a partial bottom perspective view of the array of FIG. 8.

FIG. 10 is a cross-sectional view of a linear array taken along one of the slots.

DESCRIPTION OF THE PREFERRED EMBODIMENTS

Figure 1:
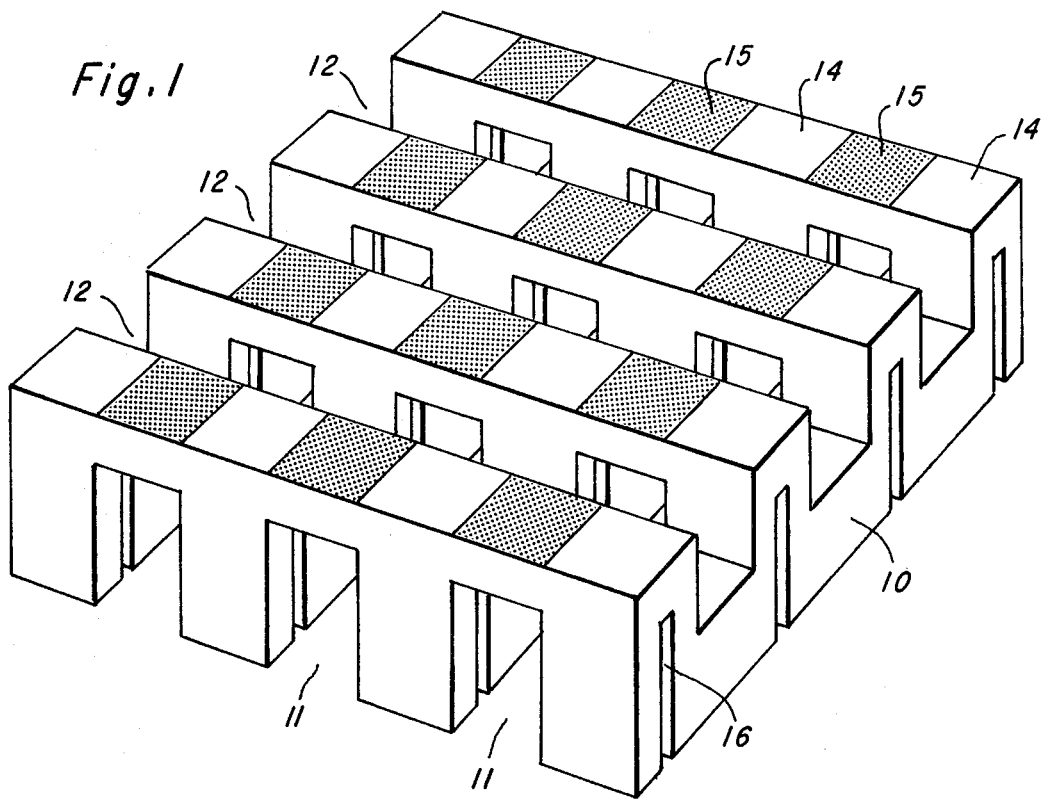
FIG. 1 is a matrix array of detectors formed in a semiconductor wafer wherein each detector has a slot formed in the central portion thereof.

Referring now to the drawings, FIG. 1 illustrates an array of detectors formed in a single semiconductor wafer by etching both the top and bottom of the wafer to form biasing slots therein which define parallel rows on each side of the wafer with the detectors being further isolated from each other by a third set of isolating slots which intersects and completely cuts one of the two sets of biasing slots. FIG. 1 shows only the central portion of the semiconductor slice and the semiconductor bars formed by the slots. In FIG. 1, the sets of slots 12 and 16, which are to serve as biasing slots, are etched into the semiconductor parallel to each other but from opposite sides of the semiconductor. Slots 12 and 16 are etched more than halfway through the slice so that there is considerable overlap. These slots may be formed by first oxidizing the semiconductor surface and then removing strips of oxide; the slots are then etched through the exposed portions of semiconductor material as defined by the pattern in the protective oxide layer. After slots 12 and 16 are etched, the walls of slots 12 and 16 may be made highly conducting by impurity diffusion using the remaining protective oxide to restrict impurity diffusion to the walls of slots 12 and 16. If the semiconductor is P-type, the impurity diffusion will be heavily P+; if the semiconductor is N-type, the impurity diffusion will be heavily N+. After diffusion, the semiconductor is reoxidized and isolating slots 11 are etched from the same side of the semiconductor slice into which the biasing slots 16 have been previously etched. The isolating slots 11 are etched slightly more deeply into the slice than the biasing slots 16 have been etched. The slots 11 thereby physically divide the walls of the slots 16 into separate isolated pairs of opposed high impurity conductive surfaces which serve as contacts for the individual detectors. The slots 11 are not impurity diffused or coated so that the walls of slots 11 are of high resistance; thus the slots 11 electrically isolate the physically isolated slots 16. The slots 11 also cut into the slots 12. On the top surface, the detectors are identified by 14 in FIG. 1 and are separated from each other by an area covered by an opaque material 15. This material is opaque to the radiation being detected. Each detector top surface 14 has an isolated portion of slot 16 beneath its active area. If the slots 11 are made extremely narrow in comparison to the detector area 14, the opaque material 15 may be omitted. Likewise, the slots 12 may be made extremely narrow to minimize the radiation entering these slots. Possible dimensions for the narrow slot array are slot widths of 0.0002 inches for slots 11, 12 and 16 and detector areas 14 of 0.002 inches by 0.002 inches.

Figure 2:
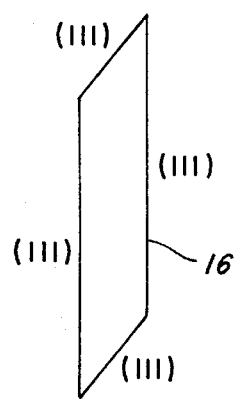
FIG. 2 illustrates the geometric shape of the slots which are bounded by (111) faces of the crystalline structure of the semiconductor material.
Figure 3:
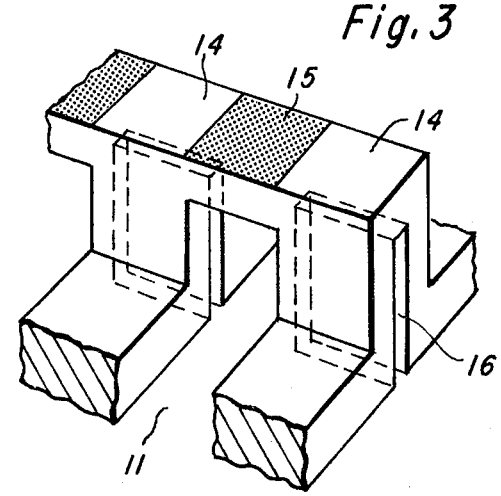
FIG. 3 is a more detailed illustration of a contact slot divided by an intersecting slot to give two isolated contacts for two detectors of the array of FIG. 1.

FIG. 2 illustrates a cross-section of the slots which are formed in the detectors. It is noticed that the slots are narrow and trapezoidal in cross-section. This configuration is formed during the etching process in which an orientation dependent etch is used. The slots are bounded by the (111) surfaces of the crystalline structure of the semiconductor material. In the case of intersecting slots, the slots must intersect at an angle corresponding to the intersection (70.53°) of the (111) planes. FIG. 3 more clearly illustrates two of the detectors and biasing slots and isolating slots formed by the fabrication process.

FIG. 1 shows the isolating top and bottom slots going from one edge of the semiconductor slice to the opposite edge of the semiconductor slice. Both the top and bottom slots will usually be of limited length and be of a trapezoidal cross-section similar to the cross-section of the slot configuration shown in FIG. 2. Outside that region of the semiconductor slice in which the slots are cut, the semiconductor may contain electronic devices such as transistors and charge coupled devices which will be used to electronically process the signal data from the detector array. Metallization leads placed over the semiconductor will interconnect the detectors with the region of the semiconductor slice in which the electronic processing circuitry is located. The incorporation of a detector matrix and electronic processing circuitry in a single semiconductor wafer is disclosed in the aforesaid pending U.S. patent application Ser. No. 563,541, filed Mar. 31, 1975.

In the particular configuration shown in FIG. 1, the slots 12 are made conductive by an impurity diffusion. The radiation field stops, designated as 15 in FIG. 1, can be a conductive metal, but must not contact the semiconductor directly underneath it and contact the semiconductor only at the two ends touching the detectors 14. This may be easily accomplished by placing an oxide on top of the semiconductor wafer prior to depositing the radiation field stop. The slots 16 which have been etched in the bottom of the detectors are impurity diffused, filled with or coated with a conductor and are in contact with a metal conductor which extends along the ridge formed by etching so that a row of detectors have a common contact. The slots 12 are contacted electrically at the end of each slot near the solid semiconductor (not shown).

The top and bottom slots 12 and 11 and the bottom hole-defining slots 16 extending into the wafer are used when forming the ohmic contacts on the array. A P+ diffusion is made in the surfaces of the wafer. If the top slots and the bottom holes 16 are filled with a conductive epoxy, metal or conductive glass, the thermal expansion coefficient of this conduct should match that of the semiconductor material being used to minimize damaging stress. The bottom strips are metallized to contact the bottom holes 16. One advantage of using a P+ diffusion into the hole-defining and slots 16 is that the highly conductive layer formed by the P+ diffusion can act as the conductive material without the addition of material having a greatly different thermal expansion coefficient as compared to that of the semiconductor material of the wafer.

Figure 4:
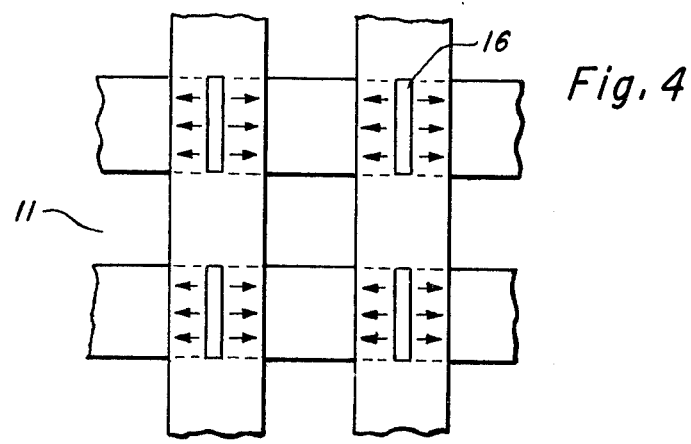
FIG. 4 is a top view of four detectors showing the direction of current flow from the central conductor formed in each detector.

FIG. 4 is a top view of the array showing four detectors with an outline of the slots therein. The arrows show the direction of current flow. Current flows from the conductive walls of slots or holes 16 to the conductive walls of slots 12. The opaque field stops on the top will keep the resistance high in adjoining regions and will prevent cross-electrical leakage between detectors in the top rows.

The bottom half of the detector is essentially inactive because there is no top conductor closely adjoining thereto. The depth to which the top slots are etched may be a major portion of the total slice thickness.

Figure 5A:
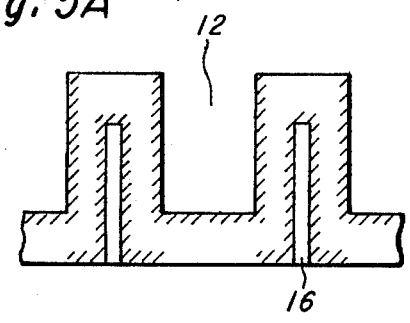
FIGS. 5A and 5B are two side views in cross section illustrating the slots that are formed in each detector.
Figure 5B:
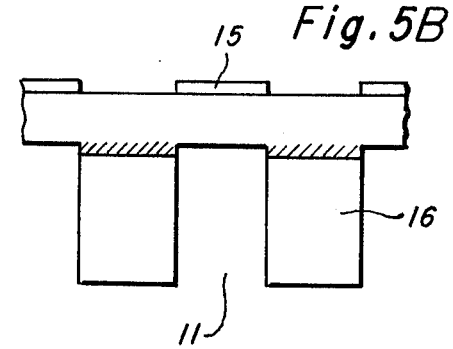

FIGS. 5A and 5B are cross-sections taken across the bottom ridges and the top ridges to show a cross-section of the slots in each detector.

The hatched areas in FIGS. 5A and 5B show the surfaces of the slots 12 and 16 which may be P+ impurity diffused if the semiconductor is P-Type and if the holes are to be made conductive by an impurity diffusion rather than by metal coating. Impurity diffusion may be masked by a coating on the semiconductor. The mask coating may be placed so that the impurity diffusion goes into the surfaces bounding the slots and also on a part of the outer surface of the semiconductor wafer connected to slots or holes 16 as shown in FIG. 5A. This outer diffused layer will facilitate electrical connection to a metal conductive layer on the bottom of semiconductor bars. Similar diffusions may be performed for the slots 12 and electrical connections made at the ends of the slots. The impurity to be diffused should have a small electronic binding energy in the semiconductor compared to the major doping impurity placed in the semiconductor for infrared sensitivity. The small binding energy for the diffused impurity is useful in that part of the semiconductor doped with this impurity will be highly conductive at the temperature at which the major infrared sensitive impurity is frozen out causing high resistance material. In P-type silicon doped with indium or gallium for infrared detection, boron would be a good choice for the diffusion impurity. Diffused impurity concentrations greater than $10^{19}$/cc will also diminish the effect of freezout at low temperatures.

In the foregoing array, the narrow slots separating detectors may be formed by orientation dependent etching. This etching process is well known and is generally discussed in the article "Semiconductor Silicon/1973," *Electrochemical Society*, 1973, p. 880, by K. E. Bean et al. The etching process has been further investigated and discussed in an article published by D. L. Kendall, Applied Physics Letters, 26, pages 195–198 (Feb. 15, 1975). In general, these articles discuss the differences in etch rate of certain crystallographic planes of silicon in the KOH—H$_2$O and KOH-alcohol etches. In particular, planes with high packing densities such as {111}, {221}, {331}, and {112} etch as much as 100 and 500 times slower than the more loosely packed {100} and {110} planes respectively.

The (100) silicon slice surface orientation provides fourflod symmetry. Therefore, the four slow-etch and slow-growth {111} planes intersect the (100) slice surface at 90° to each other, and at a rather steep angle of 54.74° to the surface. This allows the desired square or rectangular pattern for device or circuit isolation layout. Several other advantages may be gained in process control by use of the (100) silicon slice surface orientation. The etch depth, or isolation depth, may be quite accurately controlled by using an orientation-dependent etch (ODE). Due to the trace of the slow etching {111} planes intersecting the (100) surface plane at an angle of 54.74°, the etch depth becomes a direct factor, 0.707 × the etch mask opening width. That is, a mask opening 1 mil wide, properly aligned with the {110} direction, will etch 0.707 mil deep into the (100) surface, and then for practical purposes stop.

If one examines the stereographic projection of the {110} silicon crystal, a mirror-image symmetry of {111} planes intersecting the (100) surface 90° will be seen. This offers a very steep (vertical) 90°, slow etching (111) plane boundary which will give the ultimate packing density (very narrow isolation width). The etching of a properly aligned mask of straight lines in one direction, parallel to either pair of these {111} planes, provides very exact vertical etched moats. Practically no undercutting of the mask in the {111} direction occurs even at deep, 3- to 4- mil etch depths.

Figure 6:
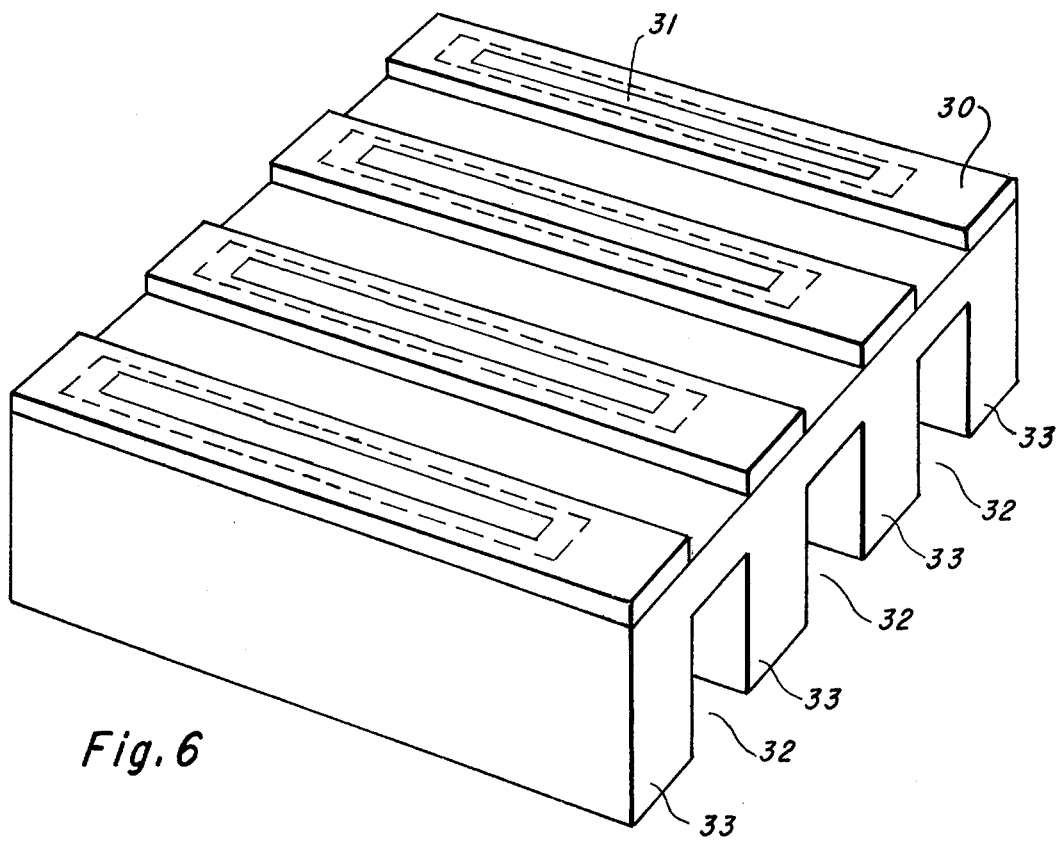
FIG. 6 is a bottom perspective view of a linear array using slots parallel to each other.

The fabrication used for the matrix embodiment of FIGS. 1 through 5 can be modified to build a particularly useful linear array embodiment. FIG. 6 shows a bottom view of this modification. The metal strips 30 shown in FIG. 6 are isolated from the semiconductor by a thin insulating layer surrounding the contact holes 31. Inside the region shown by the dashed lines, the insulation material is removed so that the metal touches the semiconductor and the conductor inside the hole 31. If the hole 31 has been made with conductive walls by an impurity diffusion, the impurity diffused area may include and be connected to an impurity diffused area on the outer surface of the semiconductor wafer which is identical to the area enclosed by the dashed lines and touching the contact metal. FIG. 7 shows the surface which receives the incident radiation. The surface which receives the incident radiation is covered continuously with metal on the top ridges separating the slots with the exception of respective openings 35 on the top of the ridges to permit the radiation to enter the semiconductor in the region of the contact holes 31 etched from the opposite side of the semiconductor slice. This linear array embodiment permits the top slots 32 to be connected together to serve as a common electrical contact; the detectors defined by the openings 35 are individually addressed electrically by the bottom contacts 30.

The isolating slots of FIGS. 6 and 7 will terminate when reaching the edges of the semiconductor slice; thus, room is left on the semiconductor slice for electronic processing circuitry. In the linear embodiments of FIGS. 6 and 7 or similar embodiments, the isolating slots 32 may actually pass completely through the semiconductor slice because the semiconductor ridges between the slots will be supported by the continuous portion of semiconductor beyond the ends of the slots. Although the isolating slots are shown the same width as the ridges, the slots may be made much more narrow than the ridges resulting in a nearly-contiguous linear array of detectors.

The isolating slots and narrow contact holes shown in FIG. 6 and 7 have their long sides parallel to each other. These parallel slots and contact holes may be etched from the same side of the semiconductor slice in a second linear embodiment. In the case of a nearly-contiguous linear array, the width of the slots and contact holes can be indentical; for instance, the dimentions could be 0.0002 inch side isolating slots, 0.0002 inch side contact holes, 0.002 wide ridges, and respective 0.002 ×0.002 inch² openings 35 thus defining a linear array of 0.002 ×0.002 inch² detectors on 0.002 inch centers.

FIG. 8 shows a top view of the second linear array embodiment. FIG. 9 shows the bottom view of this embodiment. FIG. 10 shows a side view cut parallel to the slots and narrow holes. The cross-section AA in FIG. 10 shows a cut perpendicular to the slots and holes as illustrated in FIG. 8 and 9.

FIG. 8 shows the slots 40 and holes 41 which have been etched through using an etch starting at the bottom of the slice. During etching the ends of the slots slope inwardly with these sloping sides intersecting the bottom surface at approximately 30° as shown in FIG. 10. The narrow holes lengthen as the bottom surface is approached and the holes are shown at 42 entering the cut surface on the left-hand center of FIG. 8 (this is the cross-section AA of FIG. 10). A P+ impurity diffusion is performed through holes in a diffusion mask such that the interior walls of the slots 40 and narrow holes 41 are entirely P+. The P+ walls of the narrow holes 41 are tied to a P+ diffusion on the top surface inside the dashed lines 43 around the top of each hole. This diffused surface permits better contact to the metal leads 44 and 45. The metal leads are insulated from the semiconductor by an insulation layer everywhere except in the region of contact within the diffused regions 43. The metal leads 44 are attached to electronic devices elsewhere on the surface of the semiconductor wafer. Alternatively, the leads 45 may be used or the leads to 44 and 45 may be alternated. The leads 44 and 45 also limit the incident background and signal radiation to the detecting region defined on the top surface. The detecting region is on either side of a hole 41 extending to a slot 40 on each side of the hole 41 and to the metal strips 44 and 45.

FIG. 9 shows a bottom view of the second linear array embodiment. The slots and narrow holes are much longer when they enter the bottom surface from which they were etched. The common metal lead 46 surrounds each slot 40 and touches diffused regions 47 which are attached to the diffusion on the interior walls of the slots 40. The metallization does not touch the narrow holes 41.

These arrays are intended to operate at a low enough temperature so that the resistance of the detector is set by the photogenerated majority carriers, due to the radiation background incident on top of the slice. The purpose of the opaque coating areas on the top surface is to eliminate or greatly reduce the light incident on all except the top surface of the detector. In the event that the semiconductor has been to heavily doped or its temperature is too high or the opaque parts have not been used, then some current will flow between the detectors in a single row.

As disclosed in the above mentioned co-pending patent application, these detector arrays may be formed in a single semiconductor wafer along with interfacing circuit and scanning circuitry used to scan the detectors to give a display such as a TV-type display. These arrays may be either linear or in matrix form. It is understood that in practice an actual matrix array would include many thousand detectors; however, or simplicity, only a small number of detectors have been used for purposes of illustration in this application.

The embodiments described utilize photoconductors with two ohmic contacts per detector. In the case of matrix arrays as described in FIGS. 1 through 5, electrical cross talk can be further reduced by the substitution of a P-N junction or a rectifying contact for one of the ohmic contacts to each detector. The use of a P-N junction or a rectifying contact will not have a deleterious effect on signal or on noise if all the P-N junctions addressed are biased in the forward bias direction. For instance in FIGS. 1 through 5 with a P-type semiconductor, let slots 12 be P× diffused and the hole defining slots 16 be N-type diffused. If a negative voltage is applied to one individually-defined hole 16 and a more positive voltage is applied to one slot 12, then only the one detector between the individually-defined hole 16 and the slot 12 is electronically addressed in the matrix array of FIG. 1. The series combination of the photoconductive detector plus the P-N junction will be forward biased sufficiently that the forward resistance of the junction is negligible in comparison to the resistance of the detector thereby reducing the loss of signal and the magnitude of the noise in the series connection of one detector and one junction. Other circuitous current paths will be permitted through all the other unaddressed detectors with each current path consisting of an odd number of unaddressed detectors in series. The addition of the PN junctions causes at least one reverse biased junction to appear in each circuitous path thus reducing current leakage, signal cross talk, and noise in that path.

Athough some of the drawings show embodiments in which the top and bottom slots are the same width as the detector, the invention includes all possible combinations of slot width and detector width. For instance, the slots separating detectors may be very narrow in comparison with the detector size thus forming a nearly-contiguous array of infrared detectors.

Whereas the present invention has been described with respect to significant embodiments thereof, it will be understood that various changes and modifications will be suggested to those skilled in the art and it is intended to encompass such changes and modifications as will fall in the scope of the appended claims.

I claim:

1. A monolithic infrared detector array comprising:
   a block of monocrystalline semiconductor material taken from the group consisting of silicon and germanium, said block of semiconductor material being doped with an infrared-sensitive conductivity-determining impurity and having first and second pluralities of parallel slots respectively formed in the opposite major surfaces thereof,
   said first plurality of parallel slots formed in one major surface of said semiconductor block being orthogonally related to said second plurality of parallel slots formed in the other major surface of said semiconductor block,
   a third plurality of parallel slots formed in said other major surface of said semiconductor block, said third plurality of parallel slots being parallel to said first plurality of parallel slots formed in said one major surface of said semiconductor block and being orthogonally related to and intersecting with said second plurality of parallel slots formed in said other major surface thereof,
   said third plurality of parallel slots defining respective holes extending into the semiconductor material of said semiconductor block from said other major surface thereof toward said one major surface thereof,
   a patterned metal layer opaque to infrared radiation overlying said one major surface of said semiconductor block and including a plurality of interrupted metal strips extending over the semiconductor material of said semiconductor block between successive slots formed therein;
   a plurality of semiconductor regions of said one major surface of said semiconductor block including exposed areas arranged in a plurality of linear rows across said plurality of metal strips and forming the interruptions therein,
   the exposed areas of said plurality of semiconductor regions communicating with respective portions of said semiconductor block disposed therebeneath and defining active infrared detector areas, said active infrared detector areas respectively including said holes as defined by said third plurality of parallel slots formed in said other major surface of said semiconductor block,
   said plurality of semiconductor regions respectively including portions thereof contacting the metal strip segments on opposite sides of the exposed areas of said plurality of semiconductor regions,
   insulation means interposed between the remaining portions of said patterned metal layer and said one major surface of said semiconductor block, and
   means associated with said holes providing electrically conductive areas in communication with said active infrared detector areas and said other major surface of said semiconductor block.

2. A monolithic infrared detector array as set forth in claim 1, wherein said electrically conductive area-providing means comprises spaced pairs of hole-defining opposed conductive surface regions of semiconductor material having a relatively high concentration of a dopant impurity diffused therein.

3. A monolithic infrared detector array as set forth in claim 2, wherein the opposed pairs of conductive surface regions of semiconductor material having a relatively high concentration of a dopant impurity diffused therein respectively extend onto the other major surface of said semiconductor block to define conductive margins around respective holes.

4. A monolithic infrared detector array as set forth in claim 2, further including a patterned second metal layer on the other major surface of said semiconductor block including a plurality of metal strips extending over the semiconductor material of the other major surface of said semiconductor block and forming a common electrical contact with each of said pairs of opposed conductive surface regions of semiconductor material corresponsing to a respective linear row of exposed areas of said plurality of semiconductor regions of said one major surface of said semiconductor block.

5. A monolithic infrared detector array as set forth in claim 2, wherein said third plurality of parallel slots are relatively narrow in width as compared to said first and second pluralities of parallel slots respectively formed in said one major surface and said other major surface of said semiconductor block.

6. A monolithic infrared detector array as set forth in claim 1, wherein said electrically conductive area -providing means associated with said holes comprises respective electrically conductive fillings in each of said holes.

7. A monolithic infrared detector array comprising:
   a block of monocrystalline semiconductor material taken from the group consisting of silicon and germanium, said block of semiconductor material being doped with an infrared-sensitive conductivity-determing impurity and having a plurality of parallel slots formed in at least one major surface thereof,
   a patterned first metal layer opaque to infrared radiation overlying said one major surface of said semiconductor block and including a plurality of interrupted metal strips extending over the semiconductor material of said semiconductor block between successive slots formed therein, a plurality of semiconductor regions of said one major surface of said semiconductor block including exposed areas arranged in at least one linear row across said plurality of metal strips and forming the interruptions therein, the exposed areas of said plurality of semiconductor regions communicating with respective portions of said semiconductor block disposed therebeneath and defining active infrared detector areas, said plurality of semiconductor regions respectively including portions thereof contacting the metal strip segments on opposite sides of the exposed areas of said plurality of semiconductor regions, insulation means interposed between the remaining portions of said patterned first metal layer and said one major surface of said semiconductor block, the other major surface of said semiconductor block being provided with a plurality of holes extending at least substantially through the thickness of said semiconductor block toward respective exposed areas of said plurality of semiconductor regions and in registration therewith, means defining electrically conductive areas within each of said plurality of holes, a patterned second metal layer on the other major surface of said semiconductor block including a plurality of metal strips extending over the semiconductor material of the other major surface of said semiconductor block in respective alignment with said plurality of interrupted metal strips included in said patterned first metal layer disposed on said one major surface of said semiconductor block, insulation means interposed between the plurality of metal strips included in said patterned second metal layer and said other major surface of said semiconductor block, said insulation means being patterned to define respective boundaries extending about semiconductor material of said other major surface of said semiconductor block which defines a margin around each respective hole, and said plurality of metal strips included in said patterned second metal layer respectively contacting the marginal portions of semiconductor material included in said other major surface of said semiconductor block bounding each of said holes and also contacting said electrically conductive areas within each of said holes.

8. A monolithic infrared detector array as set forth in claim 7, wherein said electrically conductive area-defining means within each of said plurality of holes comprises hole-defining conductive surface regions of semiconductor material having a relatively high concentration of a dopant impurity diffused therein.

9. A monolithic infrared detector array as set forth in claim 8, wherein the conductive surface regions of semiconductor material having a relatively high concentration of a dopant impurity diffused therein included in said hole-defining conductive surface regions extend onto the other major surface of said semiconductor block and define the margins around respective holes.

10. A monolithic infrared detector array as set forth in claim 7, wherein said electrically conductive area-defining means within each of said plurality of holes comprises respective electrically conductive fillings.

11. A monolithic infrared detector array as set forth in claim 7, wherein said plurality of parallel slots and said plurality of holes extend completely through the thickness of said semiconductor block.

12. A monolithic infrared detector array as set forth in claim 11, wherein said electrically conductive area-defining means within each of said plurality of holes comprises hole-defining conductive surface regions of semiconductor material having a relatively high concentration of a dopant impurity diffused therein.

13. A monolithic infrared detector array as set forth in claim 11, wherein said electrically conductive area-defining means within each of said plurality of holes comprises respective electrically conductive fillings.

14. An array of image detectors in a single semiconductor wafer defined by slots forming parallel rows on each side of the semiconductor wafer, which slots are used to bias the detectors, and another isolating slot in the wafer which extends through one of the biasing slots.

15. An array of image detectors in a single semiconductor wafer defined by a plurality of parallel rows in said semiconductor wafer, each row having a hole therein extending through the semiconductor wafer, the walls of each hole being conductive and forming one contact to a detector, the other contact to a detector comprises a layer conducting material on the surface of the semiconductor wafer.

16. The array according to claim 15 wherein the walls of the holes are made conductive by an impurity diffusion.

17. The array according to claim 16 wherein the parallel rows in the semiconductor wafer are defined by slots formed in one surface of the semiconductor wafer, and that impurity diffusions on one surface of the semiconductor wafer are each connected with one impurity diffusion in the walls of a hole in each detector.

18. The array according to claim 15 wherein one of the contacts to each detector is a PN junction.

19. The array according to claim 15 wherein one of the contacts to each detector is a rectifying contact.

20. A process for forming an array of image detectors comprising the steps of etching slots in one face of a semiconductor wafer to form a parallel row of ridges, each ridge containing a detector, etching a hole which extends through the ridges, and diffusing an impurity into the hole and ridges to form contact regions to the detectors.

21. An array of infrared detectors extending between two major faces of a semiconductor wafer comprising one or more rows of detectors formed in the semiconductor wafer, each row separated from adjacent wafer material and each other by slots in at least one major face of the semiconductor wafer, one contact to each detector is an ohmic contact and the other contact is a rectifying contact, all of the rectifying contacts being similarly located on the semiconductor wafer.

* * * * *